US012785362B2

(12) United States Patent
Cheng

(10) Patent No.: US 12,785,362 B2
(45) Date of Patent: Nov. 3, 2026

(54) GaN-BASED LASER AND MANUFACTURING METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 720 days.

(21) Appl. No.: 18/254,501

(22) PCT Filed: Nov. 27, 2020

(86) PCT No.: PCT/CN2020/132131

§ 371 (c)(1),
(2) Date: May 25, 2023

(87) PCT Pub. No.: WO2022/109989

PCT Pub. Date: Jun. 2, 2022

(65) Prior Publication Data

US 2024/0014634 A1 Jan. 11, 2024

(51) Int. Cl.

*H01S 5/343* (2006.01)
*H01S 5/02* (2006.01)
(Continued)

(52) U.S. Cl.

CPC .......... *H01S 5/2077* (2013.01); *H01S 5/0217* (2013.01); *H01S 5/02315* (2021.01); (Continued)

(58) Field of Classification Search

CPC ....... H01S 5/343-34393; H01S 5/0233-02345
See application file for complete search history.

(56) References Cited

U.S. PATENT DOCUMENTS 5,196,958 A 3/1993 Verbeek et al.
5,390,209 A * 2/1995 Vakhshoori ............ B82Y 20/00 372/27
(Continued)

FOREIGN PATENT DOCUMENTS

CN 1588622 A 3/2005
CN 1992166 A 7/2007
(Continued)

OTHER PUBLICATIONS

State Intellectual Property Office of the People's Republic of China, Office Action and Search Report Issued in Application No. 2020801075329, Nov. 15, 2025, 21 pages. (Submitted with English Translation).
(Continued)

*Primary Examiner* — Minsun O Harvey
*Assistant Examiner* — Fernanda Adriana Camacho Alanis
(74) *Attorney, Agent, or Firm* — Carroll, Hoette & Butscher, LLC; Christopher R. Carroll

(57) ABSTRACT

A GaN-based laser and a manufacturing method thereof are provided in this present disclosure. The GaN-based laser includes: an epitaxial substrate unit; and a light-emitting unit located on the epitaxial substrate unit, where the light-emitting unit includes an active layer unit, which is arranged parallel to the epitaxial substrate unit; the light emitting unit includes a pair of first sidewall and second sidewall, which are opposite to each other; a first reflector is provided on the first sidewall and a second reflector is provided on the second sidewall, and the first reflector or second reflector corresponds to the light emitting surface. The first reflector and the second reflector are arranged on the side surfaces of the active layer unit.

10 Claims, 7 Drawing Sheets

(51) Int. Cl.

| | |
|---|---|
| ***H01S 5/02315*** | (2021.01) |
| ***H01S 5/042*** | (2006.01) |
| ***H01S 5/20*** | (2006.01) |
| ***H01S 5/40*** | (2006.01) |

(52) U.S. Cl.

CPC ...... *H01S 5/04256* (2019.08); *H01S 5/34333* (2013.01); *H01S 5/4031* (2013.01)

(56) References Cited

U.S. PATENT DOCUMENTS

| | | | | | | |
|---|---|---|---|---|---|---|
| 5,729,563 | A | * | 3/1998 | Wang | H01S 5/423 | 372/50.23 |
| 6,111,277 | A | * | 8/2000 | Ikeda | H10H 20/0137 | 257/97 |
| 6,761,303 | B2 | * | 7/2004 | Ozawa | H10H 20/832 | 228/123.1 |
| 6,855,571 | B1 | * | 2/2005 | Sugahara | B82Y 20/00 | 438/22 |
| 8,148,716 | B2 | | 4/2012 | Ueno et al. | | |
| 8,654,811 | B2 | * | 2/2014 | Geske | H01S 5/18305 | 372/50.122 |
| 10,763,303 | B2 | | 9/2020 | Iguchi | | |
| 2003/0037722 | A1 | * | 2/2003 | Kiyoku | C30B 25/02 | 257/E21.108 |
| 2008/0309218 | A1 | * | 12/2008 | Kamikawa | H01S 5/028 | 313/498 |
| 2010/0027575 | A1 | * | 2/2010 | Ikedo | H01S 5/34333 | 372/45.011 |
| 2010/0276663 | A1 | | 11/2010 | Enya et al. | | |
| 2011/0073888 | A1 | * | 3/2011 | Ueno | B82Y 20/00 | 438/46 |
| 2011/0124142 | A1 | | 5/2011 | Enya et al. | | |
| 2014/0117392 | A1 | | 5/2014 | Kim et al. | | |
| 2015/0001556 | A1 | * | 1/2015 | Kim | C30B 29/403 | 428/141 |
| 2019/0355786 | A1 | | 11/2019 | Iguchi | | |
| 2020/0350362 | A1 | | 11/2020 | Iguchi | | |
| 2023/0073455 | A1 | | 3/2023 | Cheng | | |

FOREIGN PATENT DOCUMENTS

| | | | | | |
|---|---|---|---|---|---|
| CN | 101325310 | A | | 12/2008 | |
| CN | 101728471 | A | | 6/2010 | |
| CN | 101911322 | A | | 12/2010 | |
| CN | 102034910 | A | | 4/2011 | |
| CN | 102496666 | A | | 6/2012 | |
| CN | 103560191 | A | | 2/2014 | |
| CN | 108807609 | A | * | 11/2018 | B82Y 30/00 |
| CN | 110518107 | A | | 11/2019 | |
| WO | 2013152657 | A1 | | 10/2013 | |
| WO | 2021237528 | A1 | | 12/2021 | |
| WO | 2022109989 | A1 | | 6/2022 | |

OTHER PUBLICATIONS

State Intellectual Property Office of the People's Republic of China, Office Action and Search Report Issued in Application No. 2020801075329, Mar. 20, 2025, 16 pages. (Submitted with Machine Translation).

ISA State Intellectual Property Office of the People's Republic of China, International Search Report Issued in Application No. PCT/CN2020/132131, Aug. 31, 2021, WIPO, 6 pages.

ISA State Intellectual Property Office of the People's Republic of China, Written Opinion of the International Searching Authority Issued in Application No. PCT/CN2020/132131, Aug. 31, 2021, WIPO, 6 pages.(Submitted with Machine/Partial Translation).

* cited by examiner

GaN-BASED LASER AND MANUFACTURING METHOD THEREFOR

CROSS-REFERENCE TO RELATED APPLICATIONS

This application is a national phase entry of and claims priority to International Patent Application No. PCT/CN2020/132131 (filed 27 Nov. 2020), the entire disclosure of which is incorporated herein by reference.

TECHNICAL FIELD

This present disclosure relates to the field of semiconductor, and more particular, to a GaN-based laser and a manufacturing method of the GaN-based laser.

BACKGROUND

The band gap of GaN and GaN compounds are continuously adjustable from 0.7 eV (InN) to 6.2 eV (AlN). If the GaN-based semiconductor materials are used as light-emitting materials of the active region, the wavelength of the emitted light ranges from near infrared to deep ultraviolet, which covers the entire visible light band. Compared to traditional LED (light-emitting diode) devices, GaN-based semiconductor lasers have advantages such as high efficiency, small size, high optical power density, good directionality, and a small half width of output spectral. GaN-based semiconductor lasers are widely applied in high-density information storage, laser display, visible light communication, underwater wireless communication and so on.

With the more applications of GaN-based materials in lasers, there is a higher demand for the optical power density of GaN-based lasers in the industry.

SUMMARY

In the first aspect of the present disclosure, a GaN-based laser is provided, including:

- an epitaxial substrate unit;
- a light-emitting unit, which is located on the epitaxial substrate unit, wherein the light-emitting unit includes at least an active layer unit, which is arranged parallel to the epitaxial substrate unit; the light emitting unit includes at least a pair of first sidewall and second sidewall, which are opposite to each other, where a first reflector is provided on the first sidewall and a second reflector is provided on the second sidewall, the first reflector or the second reflector corresponds to a light-emitting surface.

In some embodiments, a reflectivity of the first reflector is 99.9%, and a reflectivity of the second reflector is 99%, the second reflector corresponds to the light-emitting surface; or a reflectivity of the first reflector is 99%, and a reflectivity of the second reflector is 99.9%, the first reflector corresponds to the light-emitting surface.

In some embodiments, isolation structures are provided on the remaining sidewalls of the light-emitting unit.

In some embodiments, the light-emitting unit includes an N-type semiconductor layer unit close to the epitaxial substrate unit, and a P-type semiconductor layer unit far from the epitaxial substrate unit; the GaN-based laser further includes a transfer carrier, a P-type electrode, and an N-type electrode, where the transfer carrier is configured to carry the P-type semiconductor layer unit, the P-type electrode is located on a non-carrying surface of the transfer carrier and electrically connected to the P-type semiconductor layer unit, and the N-type electrode is located on the N-type semiconductor layer unit.

In some embodiments, the light-emitting unit includes a P-type semiconductor layer unit close to the epitaxial substrate unit, and an N-type semiconductor layer unit far from the epitaxial substrate unit; the GaN-based laser further includes a transfer carrier, a P-type electrode, and an N-type electrode, wherein the transfer carrier carries the N-type semiconductor layer unit, the N-type electrode is located on a non-carrying surface of the transfer carrier and electrically connected to the N-type semiconductor layer unit, and the P-type electrode is located on the P-type semiconductor layer unit.

In some embodiments, when the P-type electrode is located on the non-carrying surface of the transfer carrier, the transfer carrier is a heavily doped P-type silicon substrate or silicon carbide substrate, and the P-type electrode contacts the heavily doped P-type silicon substrate or silicon carbide substrate.

In some embodiments, when the N-type electrode is located on the non-carrying surface of the transfer carrier, the transfer carrier is a heavily doped N-type silicon substrate or silicon carbide substrate, and the N-type electrode contacts the heavily doped N-type silicon substrate or silicon carbide substrate.

In some embodiments, the epitaxial substrate unit includes a first group III nitride epitaxial layer, wherein a patterned first mask layer is provided on the first group III nitride epitaxial layer;

- a second group III nitride epitaxial layer, which is located on the first group III nitride epitaxial layer, the second group III nitride epitaxial layer is horizontally healed on the first mask layer, the [0001] crystal orientations of the first group III nitride epitaxial layer and the second group III nitride epitaxial layer are respectively parallel to a thickness direction.

It should be noted that the horizontal direction in the present disclosure refers to a direction perpendicular to the thickness direction of the first group III nitride epitaxial layer.

In some embodiments, the first mask layer is a reflective layer, a light-absorbing layer, or a refractive index of the first mask layer is lower than a refractive index of the second group III nitride epitaxial layer.

In some embodiments, the material of the first mask layer is metallic silver, metallic molybdenum or silicon dioxide.

In some embodiments, a forward projection of the first mask layer on the epitaxial substrate unit falls within a forward projection of the light-emitting unit on the epitaxial substrate unit.

In some embodiments, a patterned second mask layer is provided on the second group III nitride epitaxial layer, the second mask layer is configured to restrict the second group III nitride epitaxial layer to grow laterally only to form a third group III nitride epitaxial layer, and the third group III nitride epitaxial layer heals the second group III nitride epitaxial layer;

- a fourth group III nitride epitaxial layer is located on the third group III nitride epitaxial layer and the second mask layer, and the [0001] crystal orientations of the third group III nitride epitaxial layer and the fourth group III nitride epitaxial layer are respectively parallel to the thickness direction.

In some embodiments, the epitaxial substrate unit includes a first group III nitride epitaxial layer, where a patterned first mask layer is provided on the first group III nitride epitaxial layer;

a fifth group III nitride epitaxial layer extending from one or more openings of the patterned first mask layer into the first group III nitride epitaxial layer, wherein a third mask layer is provided between the bottom wall of the fifth group III nitride epitaxial layer and the first group III nitride epitaxial layer, and side walls of the fifth group III nitride epitaxial layer are connected to the first group III nitride epitaxial layer;

a sixth group III nitride epitaxial layer, which is located on the fifth group III nitride epitaxial layer and the patterned first mask layer, wherein the [0001] crystal orientations of the first group III nitride epitaxial layer, the fifth group III nitride epitaxial layer, and the sixth group III nitride epitaxial layer are respectively parallel to the thickness direction.

In some embodiments, the epitaxial substrate unit further includes a substrate, where the first group III nitride epitaxial layer is located on the substrate.

In some embodiments, the substrate includes at least one of sapphire, silicon carbide, silicon, silicon on insulator, or lithium niobate.

In a second aspect of the present disclosure, a manufacturing method of a GaN-based laser is provided, including:

forming at least two isolation structures on an epitaxial substrate; performing epitaxial growth on the epitaxial substrate to form strip-shaped light-emitting structures with the at least two isolation structures as a mask, wherein each of the strip-shaped light-emitting structures at least includes an active layer, which is parallel to the epitaxial substrate;

dividing the strip-shaped light-emitting structures and the epitaxial substrate to form light-emitting units and epitaxial substrate units; each of the light-emitting units includes a first side wall and a second side wall, which are opposite to each other, the first side wall and the second side wall indicate dividing surfaces;

forming a first reflector on the first sidewall, and forming a second reflector on the second sidewall; wherein the first reflector or the second reflector corresponds to the light-emitting surface to form multiple GaN-based lasers.

In some embodiments, a plane in which the first sidewall and the second sidewall are located is perpendicular to the extension direction of the isolation structures.

In some embodiments, the strip-shaped light-emitting structures and the epitaxial substrate are divided by a method of etching or cutting.

In some embodiments, the light-emitting unit includes an N-type semiconductor layer unit close to the epitaxial substrate unit, and a P-type semiconductor layer unit far from the epitaxial substrate unit; the manufacturing method further includes forming a P-type electrode and an N-type electrode, where forming the P-type electrode and the N-type electrode includes:

inverting the multiple GaN-based lasers onto the transfer carrier, removing the epitaxial substrate unit to expose the N-type semiconductor layer unit;

forming the N-type electrode on the exposed N-type semiconductor layer unit, and forming the P-type electrode electrically connected to the P-type semiconductor layer unit on a non-carrying surface of the transfer carrier.

In some embodiments, the light-emitting unit includes a P-type semiconductor layer unit close to the epitaxial substrate unit, and a P-type semiconductor layer unit far from the epitaxial substrate unit; the manufacturing method further includes forming a P-type electrode and an N-type electrode, where forming the P-type electrode and the N-type electrode includes:

inverting the multiple GaN-based lasers onto the transfer carrier, removing the epitaxial substrate units to expose the P-type semiconductor layer unit;

forming the P-type electrode on the exposed P-type semiconductor layer unit, and forming the N-type electrode electrically connected to the N-type semiconductor layer unit on a non-carrying surface of the transfer carrier.

In some embodiments, when the P-type electrode is formed on the transfer carrier, the transfer carrier is a heavily doped P-type silicon substrate or silicon carbide substrate, and the P-type electrode contacts the heavily doped P-type silicon substrate or silicon carbide substrate.

In some embodiments, when the N-type electrode is formed on the transfer carrier, the transfer carrier is a heavily doped N-type silicon substrate or silicon carbide substrate, and the N-type electrode contacts the heavily doped N-type silicon substrate or silicon carbide substrate.

In some embodiments, the epitaxial substrate unit includes a first group III nitride epitaxial layer, where a patterned first mask layer is provided on the first group III nitride epitaxial layer;

a second group III nitride epitaxial layer, which is located on the first group III nitride epitaxial layer, and the second group III nitride epitaxial layer is horizontally healed on the first mask layer, the crystal orientations of the first group III nitride epitaxial layer and the second group III nitride epitaxial layer are respectively parallel to a thickness direction.

In some embodiments, the first mask layer is a reflective layer, a light-absorbing layer, or a refractive index of the first mask layer is lower than a refractive index of the second group III nitride epitaxial layer.

In some embodiments, the material of the first mask layer is metallic silver, metallic molybdenum or silicon dioxide.

In some embodiments, a forward projection of the first mask layer on the epitaxial substrate unit falls within a forward projection of the light emitting unit on the epitaxial substrate unit.

a patterned second mask layer is provided on the second group III nitride epitaxial layer, the patterned second mask layer restricts the second group III nitride epitaxial layer to grow laterally only to form a third group III nitride epitaxial layer, and the third group III nitride epitaxial layer heals the second group III nitride epitaxial layer;

a fourth group III nitride epitaxial layer is located on the third group III nitride epitaxial layer and the second mask layer, and the crystal orientations of the third group III nitride epitaxial layer and the fourth group III nitride epitaxial layer are respectively parallel to the thickness direction.

In some embodiments, the epitaxial substrate unit includes a first group III nitride epitaxial layer, where a patterned first mask layer is provided on the first group III nitride epitaxial layer;

a fifth group III nitride epitaxial layer extending from one or more openings of the patterned first mask layer into the first group III nitride epitaxial layer, wherein a third mask layer is provided between the bottom wall of the fifth group III nitride epitaxial layer and the first group III nitride epitaxial layer, and side walls of the fifth group III nitride epitaxial layer are connected to the first group III nitride epitaxial layer;

a sixth group III nitride epitaxial layer, which is located on the fifth group III nitride epitaxial layer and the graphical first mask layer, where the [0001] crystal orientations of the first group III nitride epitaxial layer, the fifth group III nitride epitaxial layer, and the sixth group III nitride epitaxial layer are respectively parallel to the thickness direction.

In some embodiments, the epitaxial substrate unit further includes a substrate, where the first group III nitride epitaxial layer is located on the substrate.

In some embodiments, the substrate includes at least one of sapphire, silicon carbide, silicon, silicon on insulator, or lithium niobate.

Figure 1:
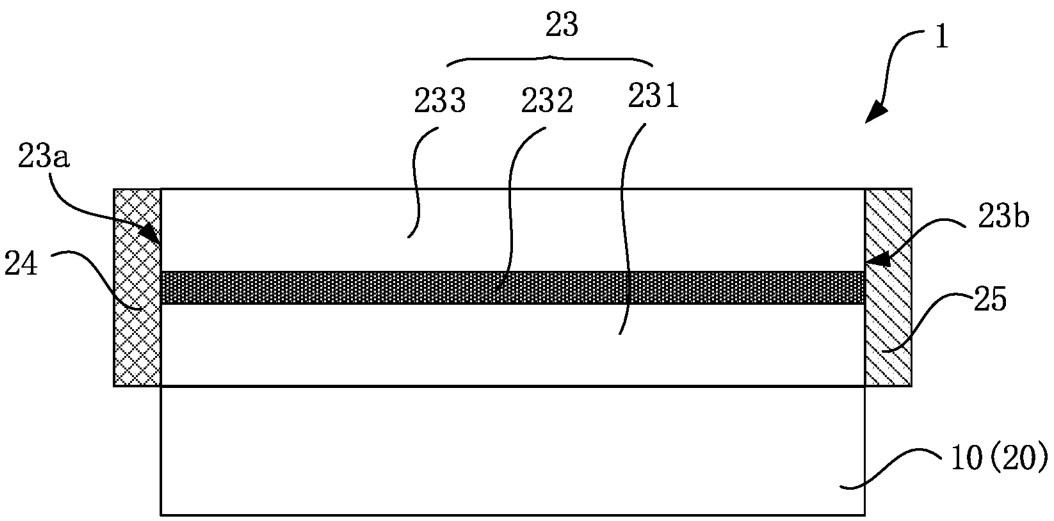
FIG. 1 and FIG. 2 are cross-sectional structural diagrams of a GaN-based laser according to a first embodiment of the present disclosure.

To facilitate the understanding of the present disclosure, all reference signs present in the present disclosure are listed below:

| | |
|---|---|
| epitaxial substrate 30 | isolation structure 21 |
| strip-shaped light-emitting structure 22 | N-type semiconductor layer 221 |
| active layer 222 | P-type semiconductor layer 223 |
| epitaxial substrate unit 20 | light-emitting unit 23 |
| N-type semiconductor layer unit 231 | active layer unit 232 |
| P-type semiconductor layer unit 233 | first sidewall 23a |
| second sidewall 23b | first reflector 24 |

-continued

| | |
|---|---|
| second reflector 25 | substrate 10 |
| first group III nitride epitaxial layer 11 | patterned first mask layer 12 |
| second group III nitride epitaxial layer 13 | patterned second mask layer 14 |
| third group III nitride epitaxial layer 15 | fourth group III nitride epitaxial layer 16 |
| fifth group III nitride epitaxial layer 17 | third mask layer 18 |
| sixth group III nitride epitaxial layer 19 | transfer carrier 40 |
| carrying surface 40a | non-carrying surface 40b |
| P-type electrode 41 | N-type electrode 42 |
| GaN-based lasers 1, 2, 3 | |

DETAILED DESCRIPTION

The purpose of the present disclosure is to provide a GaN-based laser and a manufacturing method of the GaN-based laser, in order to improve the optical power density of the GaN-based laser. In order to make the above-mentioned objects, features and advantages of the present disclosure more obvious and understandable, embodiments of the present disclosure will be described in detail below with reference to the accompanying drawings.

Figure 2:
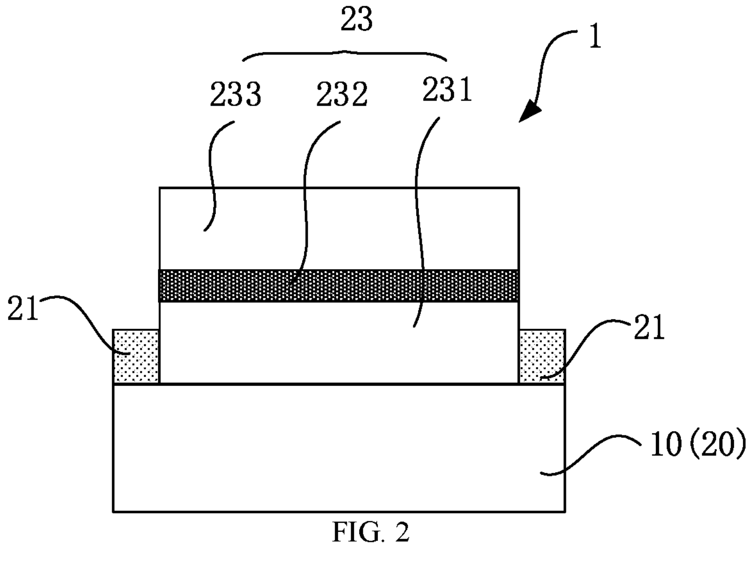

FIGS. 1 and 2 are cross-sectional structural diagrams of a GaN-based laser according to a first embodiment of the present disclosure.

As shown in FIG. 1 and FIG. 2, the GaN-based laser 1 includes:

an epitaxial substrate unit 20;

a light-emitting unit 23 on the epitaxial substrate unit 20, where the light-emitting unit 23 includes at least an active layer unit 232, which is arranged parallel to the epitaxial substrate unit 20; the light emitting unit 23 includes a pair of first sidewall 23*a* and second sidewall 23*b*, which are opposite to each other, where a first reflector 24 is provided on the first sidewall 23*a* and a second reflector 25 is provided on the second sidewall 23*b*, and the first reflector 24 or the second reflector 25 corresponds to a light-emitting surface.

In this embodiment, the epitaxial substrate unit 20 can be a substrate 10. The material of the substrate 10 can include at least one of sapphire, silicon carbide, silicon, silicon on insulator, and lithium niobate, which is not limited in this embodiment.

The light-emitting unit 23 includes an N-type semiconductor layer unit 231, an active layer unit 232, and a P-type semiconductor layer unit 233 arranged sequentially from bottom to top.

The N-type semiconductor layer unit 231 is configured to provide electrons to the active layer unit 232, and the P-type semiconductor layer unit 233 is configured to provide holes to the active layer unit 232. In this embodiment, the N-type semiconductor layer unit 231 is close to the epitaxial substrate unit 20. In other embodiments, the P-type semiconductor layer unit 233 can be close to the epitaxial substrate unit 20.

The materials of both N-type semiconductor layer unit 231 and P-type semiconductor layer unit 233 can be group III-V compounds, such as GaN. The N-type ions in the N-type semiconductor layer unit 231 can include at least one kind of Si ions, Ge ions, Sn ions, Se ions, or Te ions. The P-type doped ions in the P-type semiconductor layer unit 233 can include at least one kind of Mg ions, Zn ions, Ca ions, Sr ions, or Ba ions.

The active layer unit 232 may include at least one of a single quantum well structure, a multiple quantum well (MQW) structure, a quantum wire structure, and a quantum dot structure. The active layer unit 232 can include a potential well layer and a potential barrier layer. The band gap of the potential well layer is smaller than the band gap of the potential barrier layer.

The material of the active layer unit 232 is a group III-V compound, specifically the material of the active layer unit 232 can be a GaN-based material, which can be doped with In element, specifically InGaN for example, or with Al element, specifically AlGaN for example.

In this embodiment, the reflectivity of the first reflector 24 can be 99.9%, and the reflectivity of the second reflector 25 can be 99%. Therefore, the second reflector 25 corresponds to the light-emitting surface. The first reflector 24 and the second reflector 25 can both be Bragg reflectors. The material of the Bragg reflector can be selected from a group of multi-period materials including $TiO_2/SiO_2$, $SiO_2/SiN$, $Ti_3O_5/SiO_2$, $Ta_2O_5/SiO_2$, $Ti_3O_5/Al_2O_3$, $ZrO_2/SiO_2$, or $TiO_2/Al_2O_3$. The reflectivity of the first reflector 24 can be improved by increasing the thickness of the material with the high refractive index.

The first reflector 24 can include a metal reflector. The material of the metal reflector can be Ag, Ni/Ag/Ni, etc. An insulation layer can be arranged between the metal reflector and the first side wall 23*a*, and the material of the insulation layer can be $SiO_2$, SiN, etc. The second reflector 25 can be Bragg reflector.

In other embodiments, the reflectivity of the first reflector 24 can be 99%, and the reflectivity of the second reflector 25 can be 99.9%. Therefore, the first reflector 24 corresponds to the light-emitting surface.

As shown in FIG. 2, isolation structures 21 are provided on the remaining sidewalls of the light-emitting unit 23. The isolation structures 21 are configured to separate the light-emitting units 23, which can reduce the surface defects of the light-emitting unit 23 to improve the luminous efficiency compared to the method of separating the light-emitting units 23 by a cutting manner or an etching manner.

As shown in FIG. 1, in the GaN-based laser 1, the first reflector 24 and the second reflector 25 are respectively arranged on the side surfaces of the active layer unit 232. In other words, the laser 1 emits light from the side surfaces of the active layer unit 232, which can reduce the area for light-emitting and increase the optical power density compared to emit light from the upper and lower surfaces of the active layer unit 232.

Figure 3:
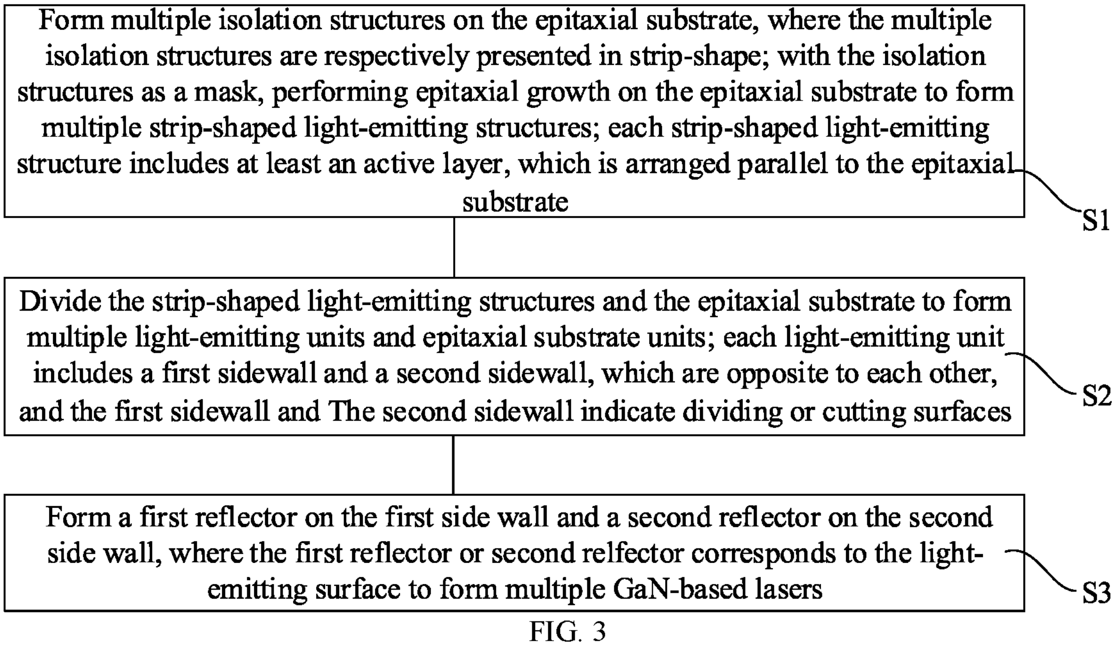
FIG. 3 is a flowchart of a manufacturing method of the GaN-based laser in FIG. 1 and FIG. 2.

The first embodiment of the present disclosure further provides a manufacturing method of the GaN-based laser shown in FIG. 1 and FIG. 2. FIG. 3 is a flowchart of the manufacturing method. FIGS. 4 to 8 are schematic views illustrating intermediate structures corresponding to processes of FIG. 3.

Figure 4:
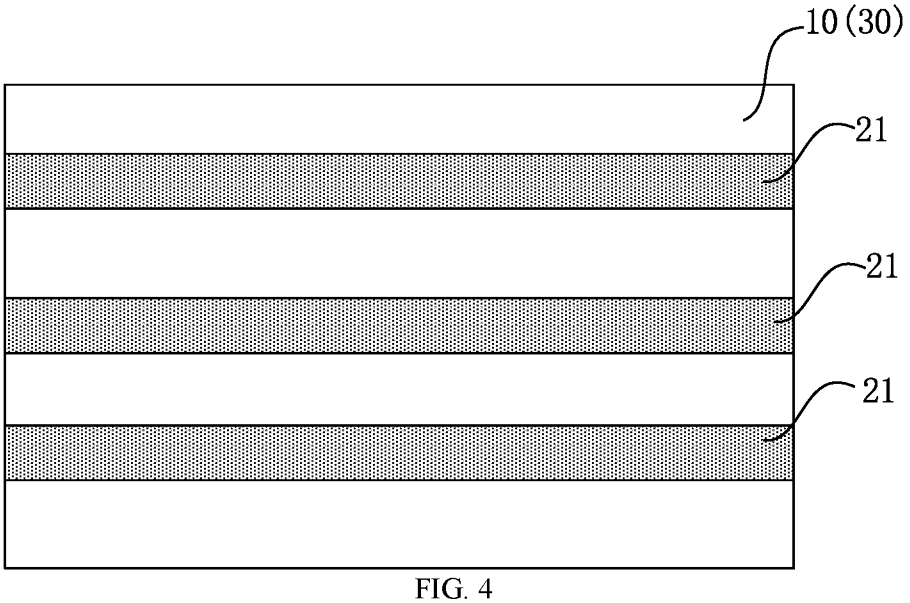
FIGS. 4 to 8 are schematic views illustrating intermediate structures corresponding to processes of FIG. 3.
Figure 5:
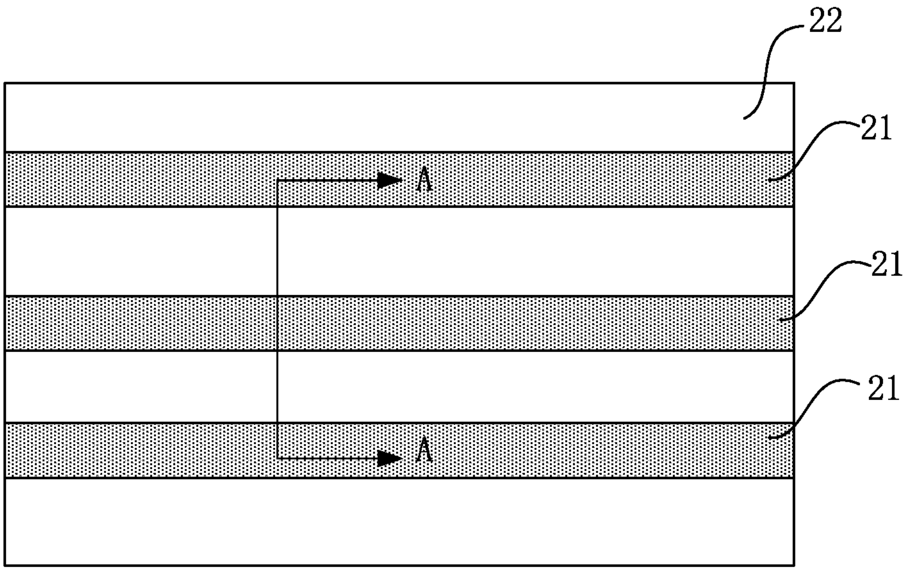
Figure 6:
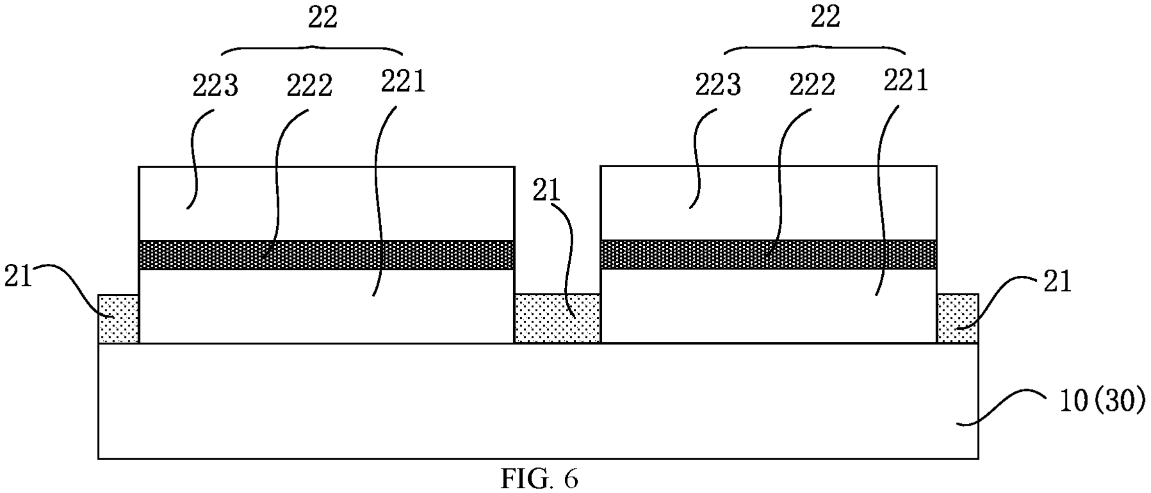

First of all, referring to step S1 of FIG. 3 and FIG. 4, multiple isolation structures 21 are formed on the epitaxial substrate 30, where the multiple isolation structures are respectively presented in strip-shape. Referring to FIGS. 5 and 6, FIG. 6 is a cross-sectional view along the AA line in FIG. 5. With the isolation structures 21 as a mask, epitaxial growth is performed on the epitaxial substrate 30 to form multiple strip-shaped light-emitting structures 22. Each strip-shaped light-emitting structure 22 includes at least an active layer 222, which is arranged parallel to the epitaxial substrate 30.

In this embodiment, the epitaxial substrate 30 can be a substrate 10. The material of substrate 10 can include at least one of sapphire, silicon carbide, silicon, silicon on insulator, and lithium niobate, which is not limited in this embodiment.

The material of the isolation structure 21 can include a dielectric material, such as silicon dioxide.

The strip-shaped light-emitting structure 22 includes an N-type semiconductor layer 221, an active layer 222, and a P-type semiconductor layer 223 arranged sequentially from bottom to top.

The N-type semiconductor layer 221 is configured to provide electrons to the active layer 222, and the P-type semiconductor layer 223 is configured to provide holes to the active layer 222. In this embodiment, the N-type semiconductor layer 221 can be close to the epitaxial substrate 30. In other embodiments, the P-type semiconductor layer 223 can be close to the epitaxial substrate 30.

The materials of both N-type semiconductor layer 221 and P-type semiconductor layer 223 can be Group III-V compounds, such as GaN. The N-type ions in the N-type semiconductor layer 221 can include at least one kind of Si ions, Ge ions, Sn ions, Se ions, or Te ions. The P-type doped ions in the P-type semiconductor layer 223 can include at least one kind of Mg ions, Zn ions, Ca ions, Sr ions, or Ba ions.

The active layer 222 may include at least one of a single quantum well structure, a multiple quantum well (MQW) structure, a quantum wire structure, and a quantum dot structure. The active layer 222 can include a potential well layer and a potential barrier layer. The band gap of the potential well layer is smaller than the band gap of the potential barrier layer.

The material of the active layer 222 is a group III-V compound, specifically the material of the active layer 222 can be a GaN-based material, which can be doped with In element, specifically InGaN for example, or with Al element, specifically AlGaN for example.

The formation process of the N-type semiconductor layer 221, and/or the active layer 222, and/or the P-type semiconductor layer 223 may include atomic layer deposition (ALD), chemical vapor deposition (CVD), molecular beam epitaxy (MBE), plasma enhanced chemical vapor deposition (PECVD), low-pressure chemical vapor deposition (LPCVD), or metal organic compound chemical vapor deposition, or a combination thereof.

Figure 7:
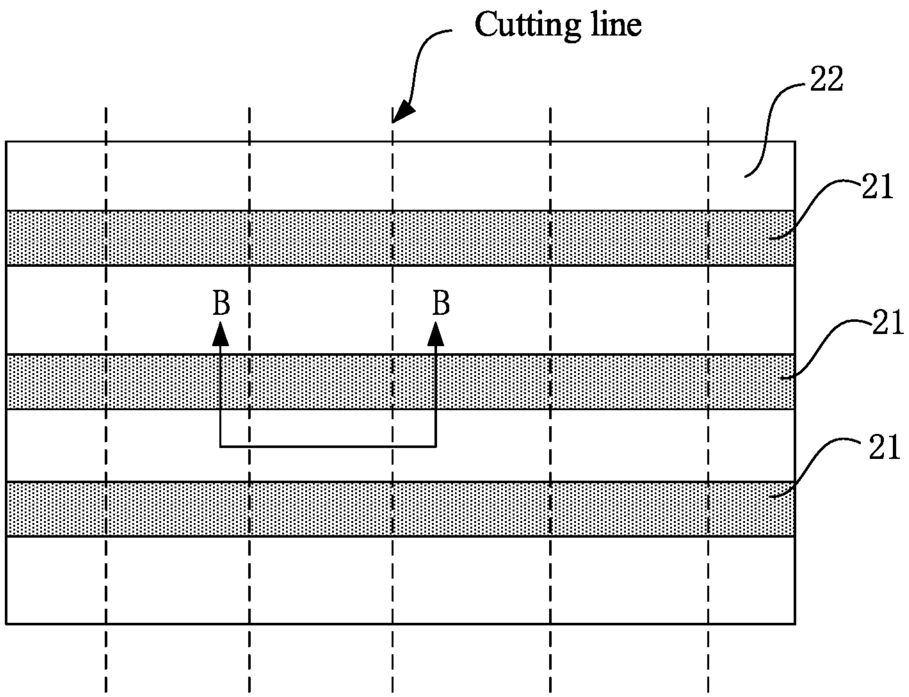
Figure 8:
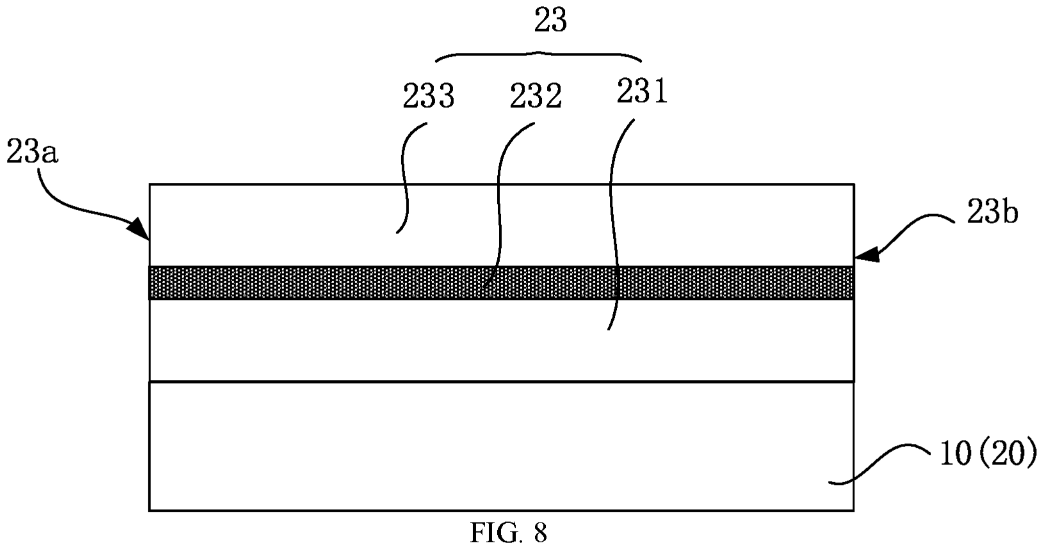

Next, referring to step S2 of FIG. 3, FIGS. 7 and 8, FIG. 8 is a cross-sectional view along the BB line in FIG. 7. The strip-shaped light-emitting structures 22 and the epitaxial substrate 30 are divided to form multiple light-emitting units 23 and epitaxial substrate units 20; each light-emitting unit 23 includes a first sidewall 23*a* and a second sidewall 23*b*, which are opposite to each other, and the first sidewall 23*a* and the second sidewall 23*b* indicate dividing or cutting surfaces.

The dividing surface can be perpendicular to the extension direction of the strip shape of the isolation structure 21, or can have an angle with the vertical direction. Specifically, the strip-shaped light-emitting structures 22 and the epitaxial substrate 30 can be divided by the method of etching or cutting. The etching method can be dry etching or wet etching.

After the N-type semiconductor layer 221 is divided, N-type semiconductor layer units 231 are formed; after the active layer 222 is divided, active layer units 232 are formed; after the P-type semiconductor layer 223 is divided, P-type semiconductor layer units 233 are formed.

It can be seen that the isolation structures 21 are provided on the remaining sidewalls of the light-emitting unit 23. The light-emitting units 23 are separated by the isolation structures 21, which can reduce the surface defects of the light-emitting unit 23 to improve the luminous efficiency compared to the method of separating the light-emitting units 23 by cutting or etching.

Next, referring to step S3 of FIG. 3 and FIG. 1, a first reflector 24 is formed on the first side wall 23*a*, and a second reflector 25 is formed on the second side wall 23*b*, where the first reflector 24 or the second reflector 25 corresponds to the light-emitting surface, so that multiple GaN-based lasers 1 are formed.

In this embodiment, the reflectivity of the first reflector 24 can be 99.9%, and the reflectivity of the second reflector 25 can be 99%. Therefore, the second reflector 25 corresponds to the light-emitting surface. The first reflector 24 and the second reflector 25 can both be Bragg reflectors. The material of the Bragg reflector can be selected from a group of multi-period materials including $TiO_2/SiO_2$, $SiO_2/SiN$, $Ti_3O_5/SiO_2$, $Ta_2O_5/SiO_2$, $Ti_3O_5/Al_2O_3$, $ZrO_2/SiO_2$, or $TiO_2/Al_2O_3$. The Bragg reflector is formed by physical vapor deposition or chemical vapor deposition corresponding to different materials. The reflectivity of the first reflector 24 can be improved by increasing the thickness of the material with the high refractive index.

The first reflector 24 can include a metal reflector. The material of this metal reflector can be Ag, Ni/Ag/Ni, etc., which is formed by sputtering method. An insulation layer can be arranged between the metal reflector and the first sidewall 23*a*, and the material of the insulation layer can be $SiO_2$, SiN, etc., which is formed by physical vapor deposition or chemical vapor deposition. The second reflector 25 can be a Bragg reflector.

In other embodiments, the reflectivity of the first reflector 24 can be 99%, and the reflectivity of the second reflector 25 can be 99.9%. Therefore, the first reflector 24 corresponds to the light-emitting surface.

In this embodiment, the first reflector 24 and the second reflector 25 are only coated on the sidewalls of the light-emitting unit 23. When the corresponding material layer is formed by method of physical vapor deposition, chemical vapor deposition, or sputtering, the dividing surface can also be fully coated, that is, the sidewall of the epitaxial substrate unit 20 can further be coated.

As shown in FIG. 7, due to multiple isolation structures 21 in step S1, the multiple strip-shaped light-emitting structures 22 are formed correspondingly. Multiple GaN-based lasers 1 located in a row are formed after the process of dividing along a direction perpendicular to the extension direction of the strip shape of the isolation structures 21. In some embodiments, along the isolation structure 21, multiple GaN-based lasers 1 located in a row may be further divided into multiple individual GaN-based lasers 1.

Figure 9:
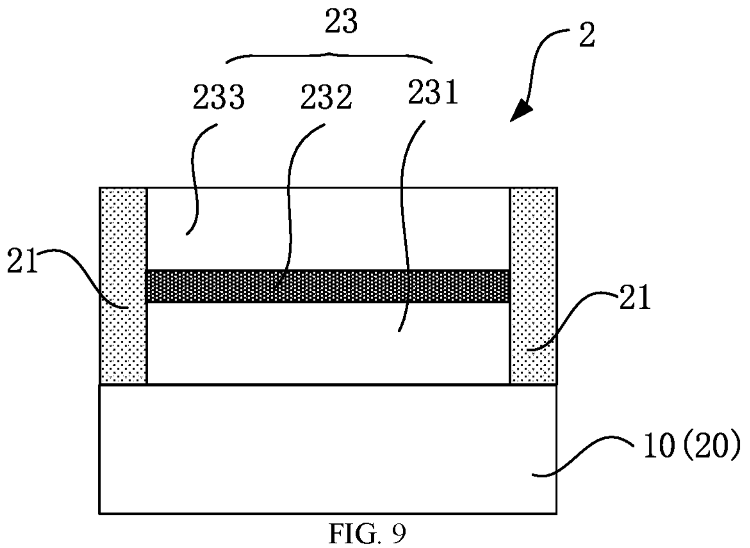
FIG. 9 is a cross-sectional structural diagram of a GaN-based laser according to a second embodiment of the present disclosure.

FIG. 9 is a cross-sectional structural diagram of a GaN-based laser according to a second embodiment of the present disclosure. As shown in FIG. 9, the GaN-based laser 2 and a manufacturing method thereof in this embodiment are approximately the same as the GaN-based laser 1 and the manufacturing method thereof in embodiments of FIGS. 1 to 8, except that the upper surface of the isolation structure 21 is approximately flush with the upper surface of the emitting unit 23.

The material of the isolation structure 21 can select a material with a refractive index lower than a refractive index of the light-emitting unit 23, so that the light emitted by the active layer unit 232 is fully reflected within the light-emitting unit 23, thereby improving the luminous efficiency.

Figure 10:
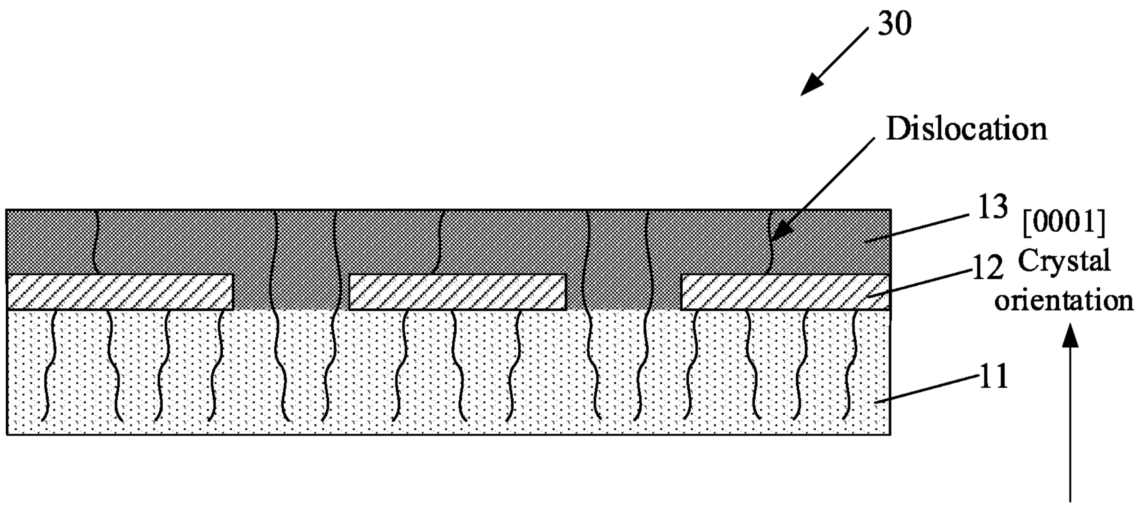
FIG. 10 is a cross-sectional structure diagram of an epitaxial substrate in a manufacturing method of a GaN-based laser according to a third embodiment of the present disclosure.

FIG. 10 is a cross-sectional structure diagram of an epitaxial substrate in a manufacturing method of a GaN-based laser of a third embodiment of the present disclosure. As shown in FIG. 10, the manufacturing method of the GaN-based laser in this embodiment is approximately the same as that of the GaN-based laser in FIGS. 1 to 9, except that in step S1, the structure of the epitaxial substrate 30 is different.

Specifically, the epitaxial substrate 30 includes: a first Group III nitride epitaxial layer 11, where a patterned first mask layer 12 is provided on the first group III nitride epitaxial layer 11; and a second group III nitride epitaxial layer 13, which is located on the first group III nitride epitaxial layer 11, and the second group III nitride epitaxial layer 13 is horizontally healed on the first mask layer 12, the [0001] crystal orientations of the first group III nitride epitaxial layer 11 and the second group III nitride epitaxial layer 13 are parallel to the thickness direction.

The materials of the first group III nitride epitaxial layer 11 and the second group III nitride epitaxial layer 13 can be the same or different, which can include at least one of GaN, AlGaN, InGaN, or AlInGaN, which is not limited in this embodiment.

Due to the fact that the dislocations in the first group III nitride epitaxial layer 11 are mainly linear dislocations in the [0001] crystal orientation, which extend in the thickness direction of the first III nitride epitaxial layer 11, the part of the second Group III nitride epitaxial layer which is growing laterally 13 can block the further upward extension of dislocations, thereby significantly reducing dislocation density and improving the crystal quality of the strip-shaped light-emitting structure 22.

In some embodiments, the first mask layer 12 can be a reflective layer, and the specific material can be Ag.

In some embodiments, the first mask layer 12 can be a light-absorbing layer, and the specific material can be Mo.

In some embodiments, the refractive index of the N-type semiconductor layer 221, the second group III nitride epitaxial layer 13, and the first mask layer 12 decrease sequentially to form a total reflection effect. The specific material of the first mask layer 12 can be silicon dioxide.

In some embodiments, the plane size of the first mask layer 12 can be much smaller than the size of the light-emitting unit 23. In other words, the first mask layers 12 are densely arranged on the first group III nitride epitaxial layer 11, and a light-emitting unit 23 corresponds to multiple first mask layers 12. During the dividing process in step S2, the forward projection of the first mask layer 12 on the epitaxial substrate unit 20 can fall within the forward projection of the light emitting unit 23 on the epitaxial substrate unit 20.

In some embodiments, the plane size of the first mask layer 12 can be approximately equivalent to the size of the light emitting unit 23, in other words, a light emitting unit 23 corresponds to a first mask layer 12. During the dividing process in step S2, the epitaxial substrate 30 can be divided from one or more openings of the first mask layer 12.

The reflective layer may be configured to reflect the leakage of light from the GaN-based laser in the downward direction. The light-absorbing layer may be configured to absorb the leakage of light from the GaN-based laser in the downward direction. The first mask layer 12 and the second group III nitride epitaxial layer 13 can form a total reflection effect, to reflect the leakage of light from the GaN-based laser in the downward direction. The above embodiments can improve the external quantum efficiency of GaN-based lasers, thereby improving the light-emitting efficiency.

Figure 11:
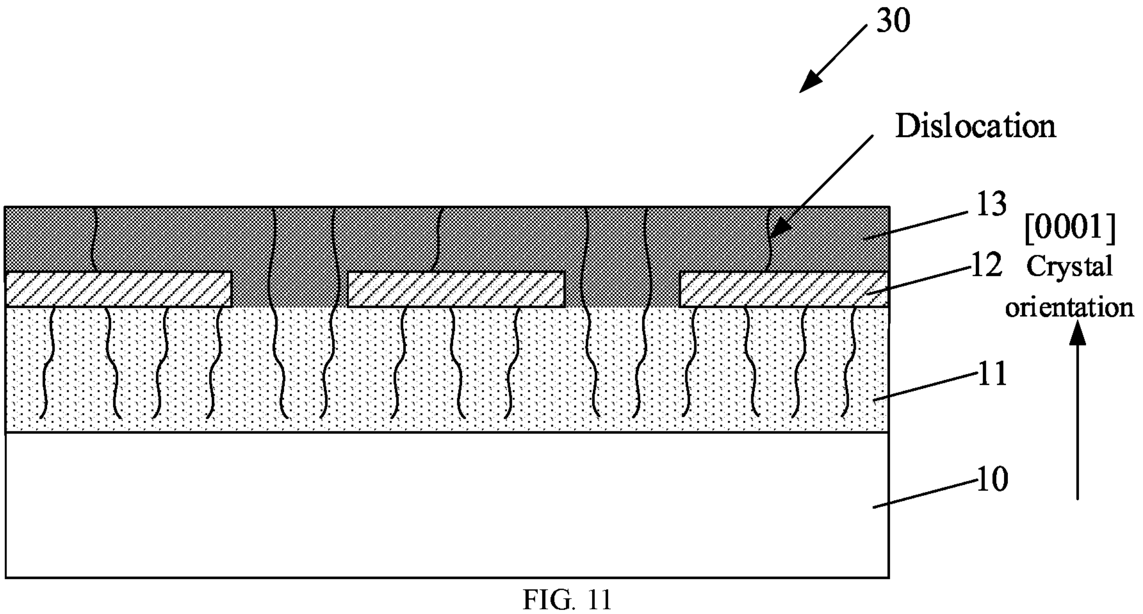
FIG. 11 is a cross-sectional structure diagram of an epitaxial substrate in a manufacturing method of a GaN-based laser according to a fourth embodiment of the present disclosure.

FIG. 11 is a cross-sectional structure diagram of an epitaxial substrate in a manufacturing method of a GaN-based laser according to a fourth embodiment of the present disclosure. As shown in FIG. 11, the structure of the epitaxial substrate 30 in this embodiment is approximately the same as that of the epitaxial substrate 30 in FIG. 10, except that the first group III nitride epitaxial layer 11 is located on the substrate 10.

The material of substrate 10 can include at least one of sapphire, silicon carbide, silicon, silicon on insulator, or lithium niobate, which is not limited in this embodiment. In other words, the first group III nitride epitaxial layer 11 can be formed on the substrate 10 by an epitaxial growth process. The material of the first group III nitride epitaxial layer 11 can be AlN, as the nucleation layer of the second group III nitride epitaxial layer 13.

Figure 12:
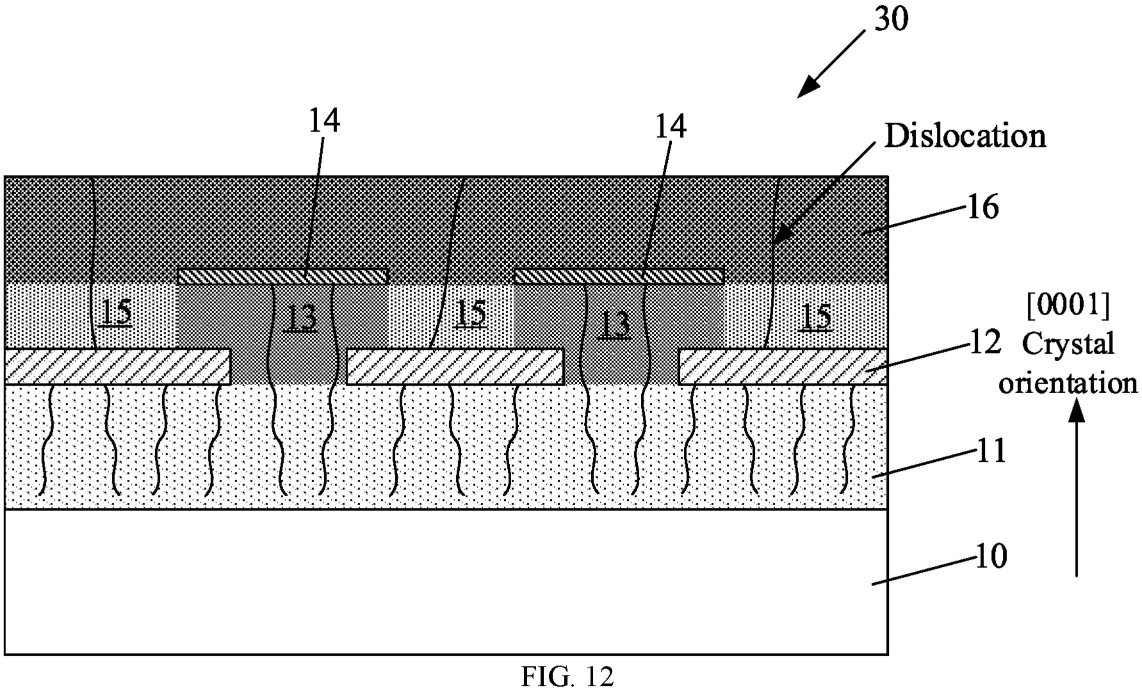
FIG. 12 is a cross-sectional structure diagram of an epitaxial substrate in a manufacturing method of a GaN-based laser according to a fifth embodiment of the present disclosure.

FIG. 12 is a cross-sectional structure diagram of an epitaxial substrate in an GaN-based laser manufacturing method according to a fifth embodiment of the present disclosure. As shown in FIG. 12, the manufacturing method of the GaN-based laser in this embodiment is approximately the same as that of the GaN-based laser in FIGS. 1 to 9, except that in step S1, the structure of the epitaxial substrate 30 is different.

Specifically, the epitaxial substrate 30 includes:

a first group III nitride epitaxial layer 11, where a patterned first mask layer 12 is provided on the first group III nitride epitaxial layer 11;

a second group III nitride epitaxial layer 13, which is located on the first group III nitride epitaxial layer 11;

a patterned second mask layer 14, which is located on the epitaxial layer 13 of the second Group III nitride; the second mask layer 14 restricts the second group III nitride epitaxial layer 13 to grow only laterally to form the third group III nitride epitaxial layer 15, and the third group III nitride epitaxial layer 15 heals the second group III nitride epitaxial layer 13;

the fourth group III nitride epitaxial layer 16, which is located on the third group III nitride epitaxial layer 15 and the second mask layer 14; the crystal orientations of the first group III nitride epitaxial layer 11, the second group III nitride epitaxial layer 13, the third group III nitride epitaxial layer 15, and the fourth group III nitride epitaxial layer 16 are parallel to the thickness direction.

The materials of the first group III nitride epitaxial layer 11, and/or the second group III nitride epitaxial layer 13, and/or the third group III nitride epitaxial layer 15, and/or the fourth Group III exptial layer 16 can be the same or different, which can include at least one of GaN, AlGaN, InGaN, or AlInGaN, which is not limited in this embodiment.

Due to the fact that the dislocations in the first group III nitride epitaxial layer 11 and the second group III nitride epitaxial layer 13 are mainly linear dislocations in the [0001] crystal orientation, that is, extend in the thickness direction of the first group III nitride epitaxial layer 11 and the second group III nitride epitaxial layer 13, the growth direction is only lateral for the epitaxial layer, which can block the further upward extension of dislocations, thereby significantly reducing dislocation density of the third group III nitride epitaxial layer 15 and the fourth group III nitride epitaxial layer 16, and improving the crystal quality of the strip-shaped light-emitting structure 22.

In some embodiments, the first mask layer 12 and the third mask layer 14 can be reflective layers, and the specific material can be Ag.

In some embodiments, the first mask layer 12 and the third mask layer 14 can be light-absorbing layers, and the specific material can be Mo.

In some embodiments, the refractive indices of the N-type semiconductor layer 221, the fourth group III nitride epitaxial layer 16, and the second mask layer 14 decrease sequentially to form a total reflection effect.

Figure 13:
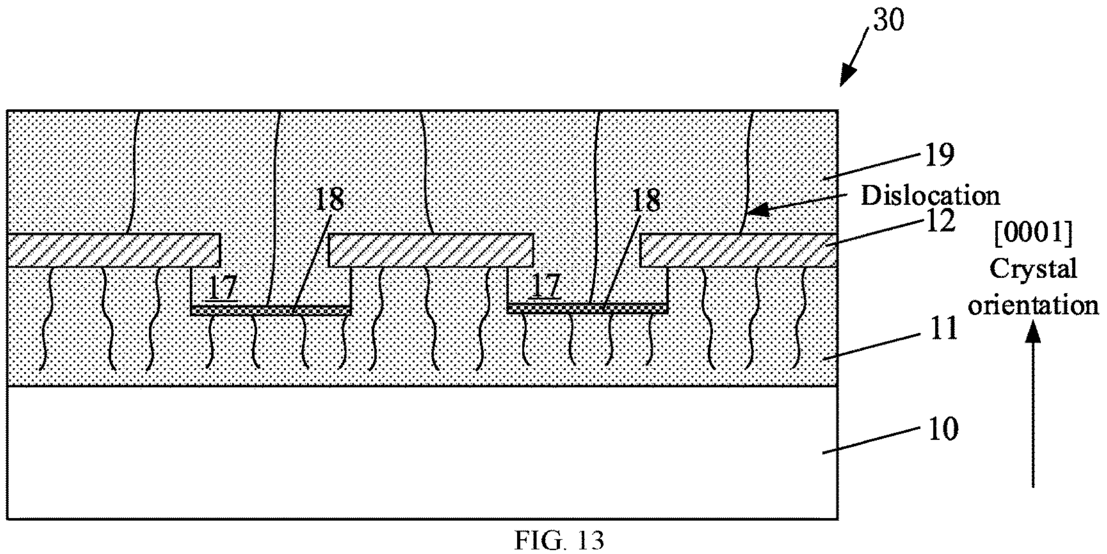
FIG. 13 is a cross-sectional structure diagram of an epitaxial substrate in a manufacturing method of a GaN-based laser according to a sixth embodiment of the present disclosure.

FIG. 13 is a cross-sectional structure diagram of an epitaxial substrate in a manufacturing method of a GaN-based laser according to a sixth embodiment of the present disclosure. As shown in FIG. 13, the manufacturing method of the GaN-based laser in this embodiment is approximately the same as that of the GaN-based laser in FIGS. 1 to 9, except that in step S1, the structure of the epitaxial substrate 30 is different.

Specifically, the epitaxial substrate 30 includes:

a first group III nitride epitaxial layer 11, where a patterned first mask layer 12 is provided on the first group III nitride epitaxial layer 11;

a fifth group III nitride epitaxial layer 17 extending from the one or more openings of the patterned first mask layer 12 into the first group III nitride epitaxial layer 11, where a third mask layer 18 is provided between the bottom wall of the fifth group III nitride epitaxial layer 17 and the first group III nitride epitaxial layer 11, and the side wall of the fifth group III nitride epitaxial layer 17 is connected to the first group III nitride epitaxial layer 11;

a sixth group III nitride epitaxial layer 19 located on the fifth group III nitride epitaxial layer 17 and the patterned first mask layer 12, where the [0001] crystal orientation of the first group III nitride epitaxial layer 11, the fifth group III nitride epitaxial layer 17, and the sixth group III nitride epitaxial layer 19 are parallel to the thickness direction.

The materials of the first group III nitride epitaxial layer 11, and/or the fifth group III nitride epitaxial layer 17, and/or the sixth III nitride epitaxial layer 19 can be the same or different, which can include at least one of GaN, AlGaN, InGaN, or AlInGaN, which is not limited in this embodiment.

Due to the fact that the dislocations in the first group III nitride epitaxial layer 11 are mainly linear dislocations in the [0001] crystal orientation, that is, extend in the thickness direction of the first group III nitride epitaxial layer 11, the growth direction is only lateral for the epitaxial layer, which can block the further upward extension of dislocations, thereby significantly reducing dislocation density of the fifth group III nitride epitaxial layer 17 and the sixth group III nitride epitaxial layer 19, and improving the crystal quality of the strip-shaped light-emitting structure 22.

In some embodiments, the first mask layer 12 and the third mask layer 18 can be reflective layers, and the specific material can be Ag.

In some embodiments, the first mask layer 12 and the third mask layer 18 can be light-absorbing layers, and the specific material can be Mo.

In some embodiments, the refractive indices of the N-type semiconductor layer 221, the sixth group III nitride epitaxial layer 19, and the first mask layer 12 decrease sequentially to form a total reflection effect.

Figure 14:
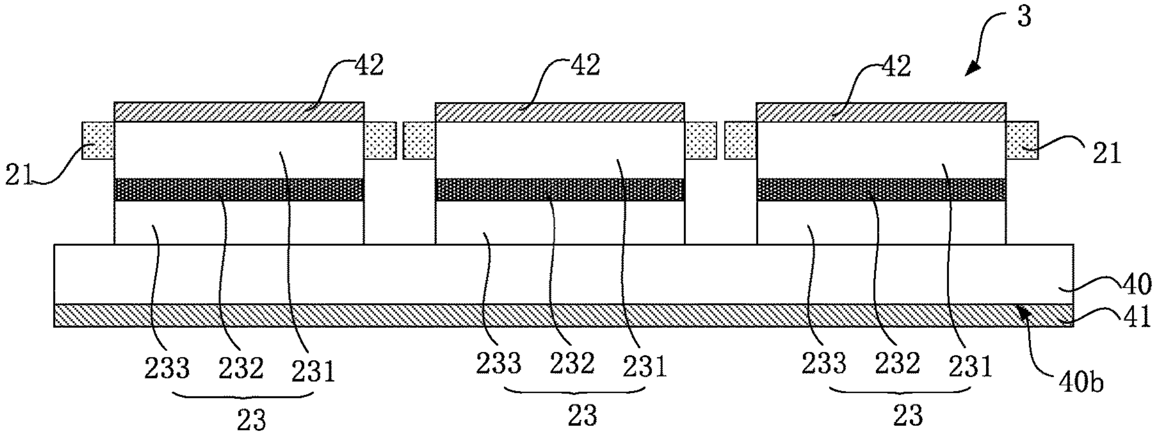
FIG. 14 is cross-sectional structural diagram of a GaN-based laser according to a seventh embodiment of the present disclosure.

FIG. 14 is cross-sectional structural diagram of a GaN-based laser according to a seventh embodiment of the present disclosure. As shown in FIG. 14, the structure of GaN-based laser 3 in this embodiment is approximately the same as that of GaN-based lasers 1 and 2 in embodiments from FIGS. 1 to 9, except that the GaN-based laser 3 further includes: a transfer carrier 40, a P-type electrode 41, and an N-type electrode 42; the transfer carrier 40 is configured to carry the P-type semiconductor layer unit 233, the P-type electrode 41 is located on a non-carrying surface 40*b* of the transfer carrier 40 and electrically connected to the P-type semiconductor layer unit 233, and the N-type electrode 42 is located on the N-type semiconductor layer unit 231.

In this embodiment, the transfer carrier 40 is a heavily doped P-type silicon substrate or silicon carbide substrate. As shown in FIG. 14, the P-type electrode 41 contacts the heavily doped P-type silicon substrate or silicon carbide substrate. In other embodiments, the transfer carrier 40 can also be a non-conductive carrier such as plastic or glass, and the P-type electrode 41 can be electrically connected to the P-type semiconductor layer unit 233 through a conductive structure passing through the transfer carrier 40.

Correspondingly, the manufacturing method of GaN-based laser 3 in this embodiment is approximately the same as that of GaN-based lasers 1 and 2 in embodiments of FIGS. 1 to 9, except that the method further includes forming a P-type electrode 41 and an N-type electrode 42.

Figure 15:
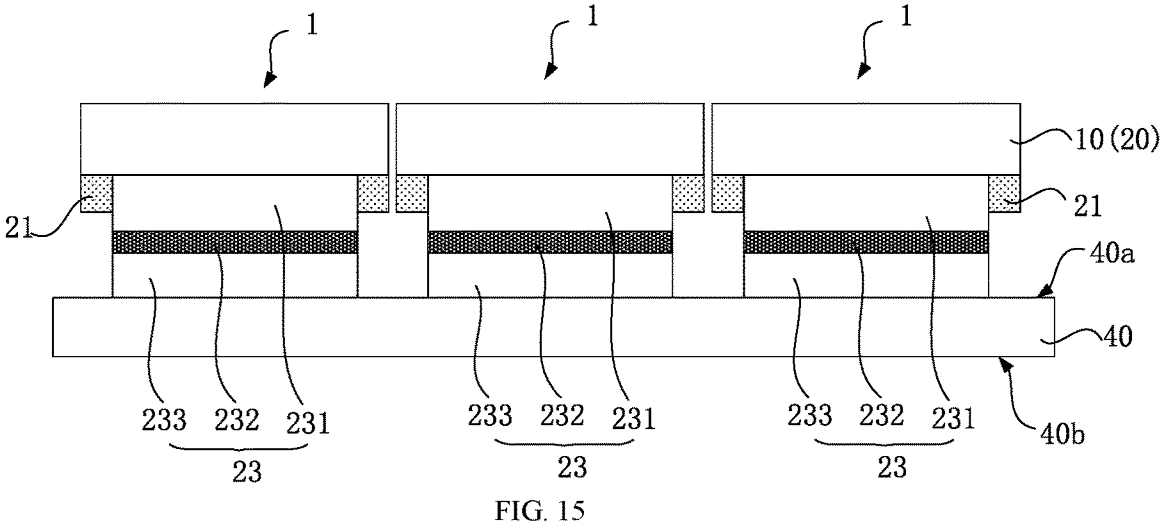
FIG. 15 is a schematic view illustrating an intermediate structure corresponding to processes of manufacturing the GaN-based laser in FIG. 14.

FIG. 15 is a schematic view illustrating an intermediate structure corresponding to processes of manufacturing the GaN-based laser in FIG. 14.

The formation of the P-type electrode 41 and the N-type electrode 42 can include:

referring to FIG. 15, multiple GaN-based lasers 1 are turned over onto the carrying surface 40*a* of the transfer carrier 40; and then, the epitaxial substrate unit 20 are removed to expose the N-type semiconductor layer units 231;

As shown in FIG. 14, an N-type electrode 42 is formed on each exposed N-type semiconductor layer unit 231, and a P-type electrode 41 electrically connected to the P-type semiconductor layer units 233 are formed on the non-carrying surface 40*b* of the transfer carrier 40.

The material of transfer carrier 40 can be a heavily doped P-type silicon substrate or silicon carbide substrate, or a non-conductive material such as plastic or glass.

The epitaxial substrate unit 20 can be removed by laser or chemical etching.

The materials of the P-type electrode 41 and the N-type electrode 42 can include at least one of gold, silver, aluminum, nickel, platinum, chromium, or titanium. For different materials, electrodes are formed by sputtering or deposition methods correspondingly.

The N-type electrode 42 is directly formed on the N-type semiconductor layer unit 231. When the material of transfer carrier 40 is a heavily doped P-type silicon substrate or silicon carbide substrate, the P-type electrode 41 is directly formed on the non-carrying surface 40*b* of the transfer carrier 40. When the material of the transfer carrier 40 is a non-conductive material such as plastic or glass, a through-hole is formed in the transfer carrier 40 before forming the P-type electrode 41. When the conductive material of the P-type electrode 41 is formed by sputtering or deposition, the conductive material fills the through-hole.

In other embodiments, in the light-emitting unit 23, when the P-type semiconductor layer unit 233 is close to the epitaxial substrate unit 20 and the N-type semiconductor layer unit 231 is far from the epitaxial substrate unit 20, the transfer carrier 40 carries the N-type semiconductor layer unit 231, the N-type electrode 42 is located on the non-carrying surface 40*b* of the transfer carrier 40 and electrically connected to the N-type semiconductor layer unit 231, and the P-type electrode 41 is located on the P-type semiconductor layer unit 233.

The transfer carrier 40 can be a heavily doped N-type silicon substrate or a silicon carbide substrate, in this situation, the N-type electrode 42 contacts the heavily doped N-type silicon substrate or silicon carbide substrate. The transfer carrier 40 can also be a non-conductive carrier such as plastic or glass, and in this situation, the N-type electrode 42 can be electrically connected to the N-type semiconductor layer unit 231 through a conductive structure passing through the transfer carrier 40.

Correspondingly, for the manufacturing method, the formation of P-type electrode 41 and the N-type electrode 42 can include:

inverting multiple GaN-based lasers 1 onto the carrying surface 40*a* of the transfer carrier 40; and then, removing the epitaxial substrate unit 20 to expose the P-type semiconductor layer units 233;

forming a P-type electrode 41 on each exposed P-type semiconductor layer unit 233, and forming an N-type electrode 42 electrically connected to the N-type semiconductor layer units 231 on the non-carrying surface 40*b* of the transfer carrier 40.

The P-type electrode 41 is directly formed on the P-type semiconductor layer unit 233. When the material of transfer carrier 40 is a heavily doped N-type silicon substrate or silicon carbide substrate, the N-type electrode 42 is directly formed on the non-carrying surface 40*b* of transfer carrier 40. When the material of the transfer carrier 40 is a non-conductive material such as plastic or glass, a through-hole is formed in the transfer carrier 40 before forming the N-type electrode 42. When the conductive material of the N-type electrode 42 is formed by method of sputtering or deposition, the conductive material fills the through-hole.

Compared with the prior art, the present disclosure has the following beneficial effects:

1) In the GaN-based laser of the present disclosure, the first reflector and the second reflector are arranged on the side surfaces of the active layer unit. In other words, the laser emits light from the side surface of the active layer unit, which can reduce the area for light-emitting and increase the optical power density compared to emit light from the upper and lower surfaces of the active layer unit.
2) In an optional solution, the GaN-based laser includes an epitaxial substrate unit and a light-emitting unit located on the epitaxial substrate unit, where isolation structures are provided on the remaining side walls of the light emitting unit. The isolation structure separates the light-emitting units, which can reduce the surface defects of the light-emitting unit to improve the luminous efficiency compared to the method of separating the light-emitting units by cutting or etching.
3) In an optional solution, the epitaxial substrate unit includes: a first group III nitride epitaxial layer, where a patterned first mask layer is on the first group III nitride epitaxial layer; and a second group III nitride epitaxial layer, which is located on the first group III nitride epitaxial layer; the second group III nitride epitaxial layer horizontally is healed on the first mask layer, and the [0001] crystal orientations of the first group III nitride epitaxial layer and the second group III nitride epitaxial layer are parallel to the thickness direction. Due to the fact that the dislocations in the first group III nitride epitaxial layer are mainly linear dislocations in the [0001] crystal orientation, which extend in the thickness direction of the first III nitride epitaxial layer, the lateral growth of the second Group III nitride epitaxial layer can block the further upward extension of dislocations, thereby significantly reducing dislocation density.

4) In the optional solutions, the first mask layer of the optional solution 3) is a reflection layer, an absorption layer, or the refractive index of the first mask layer is lower than that of the second III nitride epitaxial layer. The epitaxial substrate unit can improve the external quantum efficiency and the luminescence efficiency of GaN-based lasers regardless of reflection, absorption, or total reflection of leakage of light in the downward direction of the laser.

Although the present disclosure discloses the above contents, the present disclosure is not limited thereto. One of ordinary skill in the art can make various variants and modifications to the present disclosure without departing from the spirit and scope of the present disclosure. Therefore, the protection scope of the present disclosure should be set forth by the appended claims.

The invention claimed is:

1. A manufacturing method of a GaN-based laser, comprising:

forming at least two isolation structures on an epitaxial substrate;

performing epitaxial growth on the epitaxial substrate to form strip-shaped light-emitting structures with the at least two isolation structures as a mask, wherein each of the strip-shaped light-emitting structures comprises an active layer, which is parallel to the epitaxial substrate;

dividing the strip-shaped light-emitting structures and the epitaxial substrate to form light-emitting units and epitaxial substrate units; wherein each of the light-emitting units comprises a first sidewall and a second sidewall, which are opposite to each other, the first sidewall and the second sidewall indicate dividing surfaces, wherein each of the light-emitting units comprises an active layer unit formed from the active layer;

forming a first reflector on the first sidewall; and forming a second reflector on the second sidewall; wherein the first reflector or the second reflector corresponds to a light-emitting surface to form multiple GaN-based lasers;

wherein the light-emitting unit comprises: an N-type semiconductor layer unit close to the epitaxial substrate unit and a P-type semiconductor layer unit far from the epitaxial substrate unit, with the active layer unit between the N-type semiconductor layer unit and the P-type semiconductor layer unit; the manufacturing method further comprises: forming a P-type electrode and an N-type electrode, wherein forming the P-type electrode and the N-type electrode comprises:

inverting the multiple GaN-based lasers onto a transfer carrier;

removing the epitaxial substrate unit to expose the N-type semiconductor layer unit;

forming the N-type electrode on the exposed N-type semiconductor layer unit; and forming the P-type electrode electrically connected to the P-type semiconductor layer unit on a non-carrying surface of the transfer carrier; or the light-emitting unit comprises a P-type semiconductor layer unit close to the epitaxial substrate unit and an N-type semiconductor layer unit far from the epitaxial substrate unit, with the active layer unit between the P-type semiconductor layer unit and the N-type semiconductor layer unit; the manufacturing method further comprises forming a P-type electrode and an N-type electrode, wherein forming the P-type electrode and the N-type electrode comprises:

inverting the multiple GaN-based lasers onto the transfer carrier;

removing the epitaxial substrate unit to expose the P-type semiconductor layer unit;

forming the P-type electrode on the exposed P-type semiconductor layer unit; and forming the N-type electrode electrically connected to the N-type semiconductor layer unit on a non-carrying surface of the transfer carrier.

2. The manufacturing method according to claim 1, wherein a plane in which the first sidewall is located and a plane in which the second sidewall is located are each perpendicular to an extension direction of the isolation structures.

3. The manufacturing method according to claim 1, wherein when the P-type electrode is formed on the transfer carrier, the transfer carrier is a doped P-type silicon substrate or silicon carbide substrate, and the P-type electrode contacts the doped P-type silicon or silicon carbide substrate;

when the N-type electrode is formed on the transfer carrier, the transfer carrier is a doped N-type silicon substrate or silicon carbide substrate, and the N-type electrode contacts the doped N-type silicon substrate or silicon carbide substrate.

4. The manufacturing method according to claim 1, wherein the epitaxial substrate comprises:

a first group III nitride epitaxial layer;

a patterned first mask layer on the first group III nitride epitaxial layer;

a second group III nitride epitaxial layer, which is located on the first group III nitride epitaxial layer, and the second group III nitride epitaxial layer is horizontally grown on the patterned first mask layer, [0001] crystal orientations of the first group III nitride epitaxial layer and the second group III nitride epitaxial layer are respectively parallel to a thickness direction.

5. The manufacturing method according to claim 4, wherein the patterned first mask layer is a reflective layer made of Ag or a light-absorbing layer made of Mo.

6. The manufacturing method according to claim 5, wherein an orthographic projection of the patterned first mask layer on the first group III nitride epitaxial layer falls within an orthographic projection of the light-emitting unit on the first group III nitride epitaxial layer, and wherein the light-emitting unit corresponds to the patterned first mask layer, and a size of the orthographic projection of the patterned first mask layer on the first group III nitride epitaxial layer is equivalent to a size of the orthographic projection of the light-emitting unit corresponding to the patterned first mask layer on the first group III nitride epitaxial layer.

7. The manufacturing method of GaN-based laser according to claim 4, wherein a patterned second mask layer is provided on the second group III nitride epitaxial layer, the patterned second mask layer restricts the second group III nitride epitaxial layer to grow laterally only to form a third group III nitride epitaxial layer, and the third group III nitride epitaxial layer grows next to the second group III nitride epitaxial layer;

a fourth group III nitride epitaxial layer is located on the third group III nitride epitaxial layer and the patterned second mask layer, and [0001] crystal orientations of the third group III nitride epitaxial layer and the fourth group III nitride epitaxial layer are respectively parallel to the thickness direction.

8. The manufacturing method according to claim 1, wherein the epitaxial substrate unit comprises:

a first group III nitride epitaxial layer, a patterned first mask layer on the first group III nitride epitaxial layer;

a fifth group III nitride epitaxial layer extending from one or more openings of the patterned first mask layer into the first group III nitride epitaxial layer;

a third mask layer between a bottom wall of the fifth group III nitride epitaxial layer and the first group III nitride epitaxial layer, and side walls of the fifth group III nitride epitaxial layer are connected to the first group III nitride epitaxial layer;

a sixth group III nitride epitaxial layer, which is located on the fifth group III nitride epitaxial layer and the patterned first mask layer, wherein [0001] crystal orientations of the first group III nitride epitaxial layer, the fifth group III nitride epitaxial layer, and the sixth group III nitride epitaxial layer are respectively parallel to a thickness direction.

9. A GaN-based laser, comprising:

an epitaxial substrate unit;

a light-emitting unit, which is located on the epitaxial substrate unit, wherein the light-emitting unit comprises an active layer unit, which is arranged parallel to the epitaxial substrate unit; the light-emitting unit comprises a first sidewall and a second sidewall, which are opposite to each other, where a first reflector is provided on the first sidewall and a second reflector is provided on the second sidewall, the first reflector or the second reflector corresponds to a light-emitting surface;

wherein the epitaxial substrate unit comprises:

a first group III nitride epitaxial layer;

a patterned first mask layer on the first group III nitride epitaxial layer;

a fifth group III nitride epitaxial layer extending from one or more openings of the patterned first mask layer into the first group III nitride epitaxial layer;

a third mask layer between a bottom wall of the fifth group III nitride epitaxial layer and the first group III nitride epitaxial layer, wherein side walls of the fifth group III nitride epitaxial layer are connected to the first group III nitride epitaxial layer;

a sixth group III nitride epitaxial layer, which is located on the fifth group III nitride epitaxial layer and the patterned first mask layer, wherein [0001] crystal orientations of the first group III nitride epitaxial layer, the fifth group III nitride epitaxial layer, and the sixth group III nitride epitaxial layer are respectively parallel to a thickness direction;

wherein the patterned first mask layer is a reflective layer made of Ag or a light-absorbing layer made of Mo;

wherein an orthographic projection of the patterned first mask layer on the epitaxial substrate unit falls within an orthographic projection of the light-emitting unit on the epitaxial substrate unit; and wherein the light-emitting unit corresponds to the patterned first mask layer, and a size of the orthographic projection of the patterned first mask layer on the epitaxial substrate unit is equivalent to a size of the orthographic projection of the light-emitting unit corresponding to the patterned first mask layer on the epitaxial substrate unit.

10. The GaN-based laser according to claim 9, wherein the third mask layer is a reflective layer made of Ag or a light-absorbing layer made of Mo.

* * * * *